United States Patent [19]

Kawatsuki et al.

[11] Patent Number: 4,842,969
[45] Date of Patent: Jun. 27, 1989

[54] TRANSMITTANCE MODULATION PHOTOMASK, PROCESS FOR PRODUCING THE SAME, AND PROCESS FOR PRODUCING DIFFRACTION GRATINGS USING THE SAME

[75] Inventors: Nobuhiro Kawatsuki; Katsuya Fujisawa; Ichiro Matsuzaki; Masao Uetsuki, all of Kurashiki, Japan

[73] Assignee: Kuraray Company, Ltd., Kurashiki, Japan

[21] Appl. No.: 127,170

[22] Filed: Dec. 1, 1987

[30] Foreign Application Priority Data

Dec. 6, 1986 [JP] Japan ................. 61-290992

[51] Int. Cl.$^4$ ............................... G03F 1/00
[52] U.S. Cl. ........................ 430/5; 430/1; 430/321; 430/323; 350/162.22
[58] Field of Search ................ 430/1, 2, 4, 5, 321, 430/323; 350/162.21, 162.22, 162.23

[56] References Cited

U.S. PATENT DOCUMENTS 3,777,633 12/1973 Kirk .......................... 430/321 X
4,414,317 11/1983 Culp et al. .................. 430/4

Primary Examiner—Jose G. Dees
Attorney, Agent, or Firm—Oblon, Fisher, Spivak, McClelland & Maier

[57] ABSTRACT

The present invention provides a process for producing a blazed diffraction grating by using a transmission modulation diffraction grating as a photomask in photolithography. The photomask is composed of a relief modulation diffraction grating (A) made of a transparent material and a blazed diffraction grating (B) made of a material containing a ray absorbing agent. The diffraction grating (A) and the diffraction grating (B) are mated with each other through their grating surfaces.

17 Claims, 5 Drawing Sheets

TRANSMITTANCE MODULATION PHOTOMASK, PROCESS FOR PRODUCING THE SAME, AND PROCESS FOR PRODUCING DIFFRACTION GRATINGS USING THE SAME

FIELD OF THE INVENTION

This invention relates to a photomask having a light transmittance which varies along the pattern of the diffraction grating. It also relates to a process for producing a diffraction grating by the use of the photomask and a known photoresist.

BACKGROUND OF THE INVENTION

As used herein, the term "blazed diffraction grating" refers to a relief modulation diffraction grating in which the cross sectional shape of the individual periodic grooves is inclined with respect to the entire surface of the grating so that the diffraction grating works more efficiently. For a general description of blazed diffraction gratings, reference may be had to, for example, T. Aoyagi et al, Applied Physics Letters, Vol. 29, No. 5, page 303 (September 1976).

As used herein, the term "relief modulation diffraction grating" refers to a diffraction grating having a periodic rugged structure on the surface as shown in FIG. 8. A relief modulation diffraction grating is contrasted with a refractive index modulation diffraction grating.

The following methods are known for producing blazed relief diffraction gratings:

(a) Directly cutting the substrate plate with a ruling engine.

(b) Drawing directly on the resist coated on the substrate with an electron beam which is changed in dose. Refer to, for example, T. Fujita et al, Opt. Lett., Vol. 7, No. 12, page 578 (December 1982).

(c) Coating the substrate with a photoresist, exposing the photoresist through a mask to form a periodic resist pattern, and carrying out etching aslant with an active or an inactive ion beam using the resist pattern as a mask. Refer to, for example, T. Fujita et al, Applied Physics Letter, Vol. 29, No. 5, page 303 (September 1976).

(d) Exposing and developing a thin resist through the asymmetric double-beam interference exposure method, thereby directly forming a blazed diffraction grating. Refer to, for example, G. Schmahl et al, Progress In Optics, issued by E. Wolf, North-Holland, Amsterdam, 14, page 195 (1976).

The known methods, however, have their respective disadvantages. Method (a) takes a long time for production and leads to a high production cost. Method (b) needs a complex, large apparatus to change the dose, and it is not suitable for drawing a large area. In other words, it can be applied only to the production of small gratings. Methods (b) and (c) need complex, large apparatus, which leads to a high production cost. Method (d) can be used with a simpler apparatus and permits the production of larger gratings than method (b), but it is poor in productivity, which leads to a high production cost. Moreover, method (d) is limited in the shape of the grooves which it can produce The diffraction gratings produced by the above-mentioned methods are inevitably high in cost because of their poor productivity. While the relief modulation diffraction gratings produced by any of the above-mentioned methods (a to d) may be used to make a mold from which replicas are formed, this process is so complex that it is only possible with a high production cost.

OBJECTS OF THE INVENTION

The present invention was completed with the above-mentioned prior art in mind.

It is a principal object of the present invention to provide a relief modulation diffraction grating having various blaze patterns which is capable of mass production at a low cost.

It is another object of the present invention to provide a transmittance modulation photomask for providing a relief modulation diffraction grating.

It is a further object of the present invention to provide a diffraction grating of another type (refractive index modulation type which is obtained by using the photomask.

SUMMARY OF THE INVENTION

According to the present invention, the photomask is produced by coating a layer of an ultraviolet absorbing agent on the relief modulation side of a relief modulation diffraction grating. The layer of an ultraviolet absorbing agent has at least approximately the same refractive index as the substrate of the relief modulation diffraction grating. Using the resulting photomask, the relief modulation diffraction pattern is produced by a single exposure. Thus, according to the present invention, the production process is simple and permits mass production.

DETAILED DESCRIPTION OF THE PREFERRED EMBODIMENTS

Figure 2:
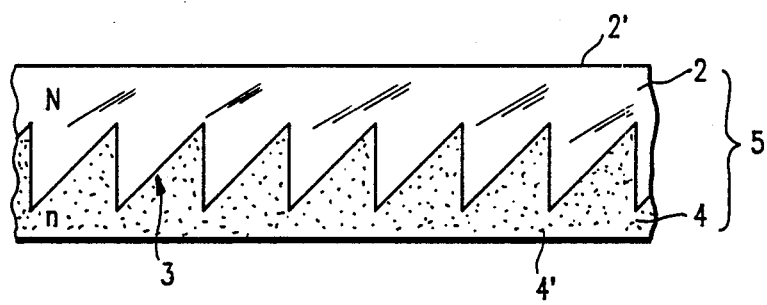
FIG. 2 is an enlarged sectional view showing the major part of the photomask of the blazed diffraction grating in a first embodiment of the present invention.

The present invention relates to a transmittance modulation photomask 5 which is composed of a blazed diffraction grating 2 made of a transparent material and a blazed diffraction grating 4 made of a material containing a ray absorbing agent. The two diffraction gratings mate with each other through their respective grating surfaces as shown in FIG. 2.

In general, there is a relationship between the light transmittance T and the thickness of a layer containing a ray absorbing agent which is defined by the following equation:

Log (1/T) or thickness

Figure 4:
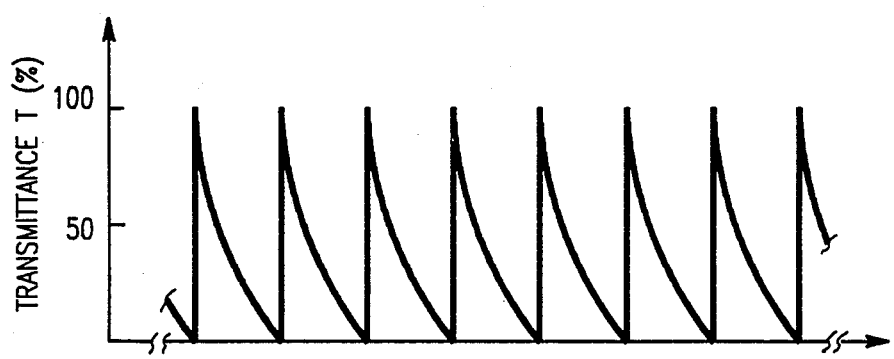
FIG. 4 is a graph showing the transmittance of the photomask shown in FIG. 2.
Figure 3:
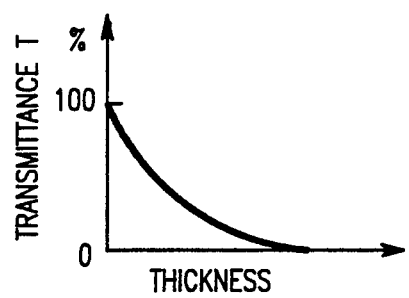
FIG. 3 is a graph showing the relationship between the transmittance and the thickness of the ultraviolet ray absorber used for the photomask as shown in FIG. 2.

This relationship is illustrated in FIG. 3. The transmittance modulation photomask 5 constructed as shown in FIG. 2 forms a photomask which gives a light transmittance which periodically changes along the pattern of the diffraction grating as shown in FIG. 4.

The photomask of the present invention is produced in the following manner.

Figure 1:
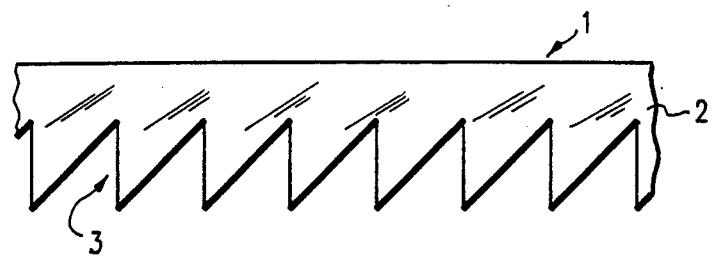
FIG. 1 is an enlarged sectional view showing the major part of the blazed diffraction grating used in the present invention.

The first step is to prepare an original blaze diffraction grating 1 the enlarged sectional view of which is shown in FIG. 1. It is produced by forming a blazed grating pattern 3 on one side of a substrate composed of, for example, pyrex glass using a ruling engine or the like. In addition to pyrex glass, the substrate may be made of any material that transmits light such as ultraviolet light.

The surface of the blaze diffraction grating 2 may be formed by any of the following methods in addition to cutting with the ruling engine:

(1) By drawing the pattern directly on a resist on the substrate with a beam (such as an electron beam, an ion beam, a laser beam, or an X-ray beam) which varies in dose.

(2) By forming a periodic pattern of resist on the substrate by an appropriate method and subsequently applying a beam through the resist pattern as a mask, thereby performing etching aslant.

(3) By directly forming the surface of the blaze diffraction grating by the asymmetric double-beam interference exposure method, which employs a parallel ray and a slant incident ray (see FIG. 15) in combination or a parallel ray and a divergent ray in combination.

Although it is possible to form the diffraction grating directly on a photoresist, the following alternative is desirable because the photoresist is usually poor in light resistance, moisture resistance, and mechanical strength. That is, the above-mentioned diffraction grating surface is formed on a substrate which is practically durable as a photomask. Subsequently, the diffraction grating surface of a photoresist is exposed to dry etchings such as plasma etching, sputtering etching, reactive ion beam etching, or the like, and the etched pattern is transferred to the surface of the durable substrate (this is known as the "transfer method"). The durable substrate can be selected from any material suitable for etching. An example is an organic polymeric material (containing or not containing a ray absorbing agent) which is formed on a glass substrate by means of such a coating method. Such a substrate is easily etched by oxygen plasma.

A blazed grating pattern 3 of the blaze diffraction grating 2 is subsequently coated with a layer forming a blazed diffraction grating 4 as shown in FIG. 2. The layer is made of a ray absorbing agent or a composition containing it, and the ray absorbing agent has a refractive index n which is at least approximately equal to the refractive index N of the blazed diffraction grating 2. The coating is made such that the surface 4' of the coating is at least approximately parallel to the surface 2' of the blazed diffraction grating 2.

The blazed diffraction grating 4 of the ray absorbing agent is formed by coating a material having the desired ray absorbing ability. An example is a binder resin containing an ultraviolet light absorbing agent such as 2,2-dihydroxy-4-methoxybenzophenone. It is important that the binder resin should have a refractive index n which is at least approximately equal to the refractive index N of the transparent blazed diffraction grating 2. A difference between them smaller than 0.01 is acceptable in practice. However, the difference should preferably be smaller than 0.001. If the difference is greater than 0.01, the resulting diffraction grating is of poor quality because diffraction of rays takes place at the interface 3' between the original diffraction grating 1 and the blazed diffraction grating 4 containing the ray absorbing agent.

It is important that the original diffraction grating 1 and the blazed diffraction grating 4 containing the ray absorbing agent be tightly bonded to each other. To this end, the interface may be treated with an appropriate surface treating agent or adhesive. In addition, it is desirable to carry out heat treatment after the blazed diffraction grating 4 containing the ray absorbing agent has been formed. In the case where the layer contains a synthetic resin, the temperature for heat treatment should be in the neighborhood ($\pm 50°$ K.) of its glass transition point ($T_g$). The heat treatment greatly improves the close adherence of the two blazed diffraction gratings.

The ray absorbing agent and the binder resin can be selected from a broad range of inorganic and organic materials that remain transparent. The layer of the ray absorbing agent can be formed by coating, vacuum deposition, or any other appropriate method. The upper and lower surfaces of the photomask can be made parallel by, for example, polishing after the layer of the light absorbing agent has been made.

In the case where the original blazed diffraction grating 1 itself is made of a ray absorbing material, the blazed diffraction grating form may be made of any transparent material without ray absorbing agent. The original diffraction grating 1 made of a light absorbing material can be easily prepared by the above-mentioned "transfer method" involving dry etching which is carried out through the diffraction grating of a photoresist formed on the light absorbing material.

Figure 10:
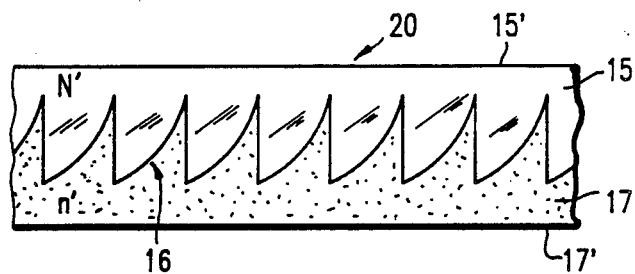
FIG. 10 is a sectional view showing the major part of the photomask in a second embodiment of the present invention.

The description made so far is concerned with a photomask 5 of the transmittance modulation type in which the blazed grating pattern 3 of the blazed diffraction grating 2 has a serrate cross section (such as a triangular cross section). However, an alternative as shown in FIG. 10 is possible. In the photomask 20 of the transmittance modulation type, the blazed diffraction grating is made on a substrate 15 of a material that transmits rays. The grating surface 16 has curved surfaces, which may be formed by cutting with a ruling engine or by any other appropriate method as in the above-mentioned example.

Figure 12:
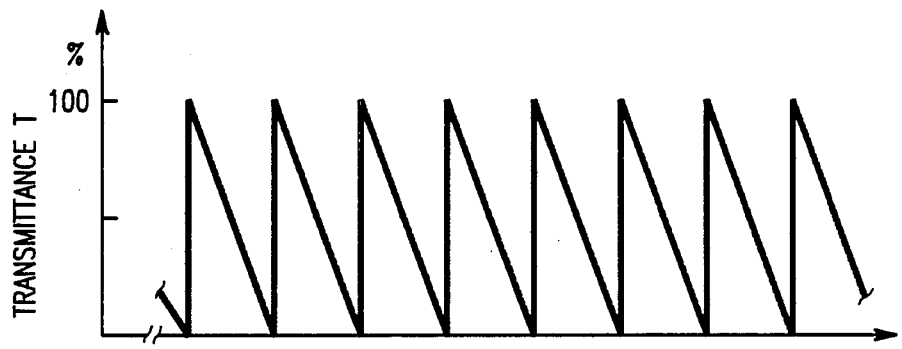
FIG. 12 is a graph showing the transmittance of the photomask shown in FIG. 10.

Subsequently, the grating surface 16 on the substrate 15 is coated with an ultraviolet ray absorbing agent 17 having a refractive index n' at least approximately equal to the refractive index N' of the substrate 15. The coating is carried out such that the surface 17' of the coating is parallel to the surface 15' of the substrate 15. The layer of the ultraviolet ray absorbing agent 17 thus formed provides the resulting photomask with a light transmittance T' which periodically changes along the pattern of the original diffraction grating as shown in FIG. 12.

The following description is concerned with a method for producing a blazed diffraction grating by exposure, followed by development, through the transmittance modulation photomask.

Figure 5:
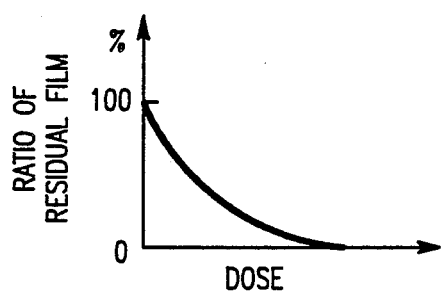
FIG. 5 is a graph showing the relationship between the ratio of residual film and the exposure of the photosensitive resin which is exposed to the photomask shown in FIG. 2.
Figure 11:
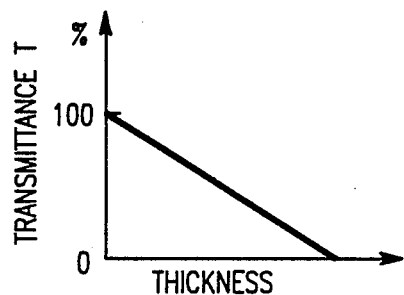
FIG. 11 is a graph showing the relationship between the transmittance and the thickness of the ultraviolet ray absorber used for the photomask shown in FIG. 10.
Figure 6:
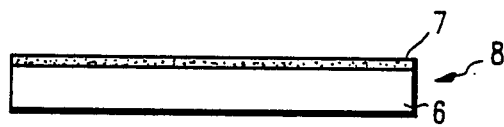
FIGS. 6 to 9 are diagrammatic sectional views showing the process for producing the diffraction grating using the photomask of the present invention.

A substrate 6 made of a transparent material is coated by spin coating, as shown in FIG. 6, with a solution of a photosensitive resin 7 which is adjusted such that the ratio of residual film varies according to dose (amount of exposure) as shown in FIG. 5. That is:

$$\text{ratio of residual film} = \frac{\text{thickness of film}(= \text{coating layer}) \text{ after exposure and development}}{\text{thickness of film}(= \text{coating layer}) \text{ before exposure}} \times 100\%$$

Figure 7:
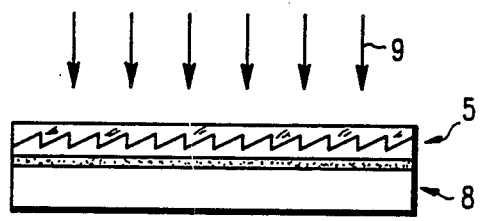
Figure 8:
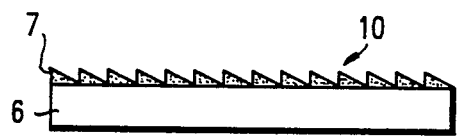

The coating thickness is about 1 μm. After drying, a coated substrate 8 is obtained. On the coated substrate 8 is placed a photomask 5 of the transmittance modulation type which was prepared as illustrated in FIG. 2. The coated substrate 8 is uniformly exposed to an appropriate amount of parallel light 9 through the photomask 5 as shown in FIG. 7. After exposure, development is carried out to give a blazed diffraction grating 10 in which the photosensitive resin 7 is formed in a serrate pattern on the substrate 6 as shown in FIG. 8.

Figure 9:
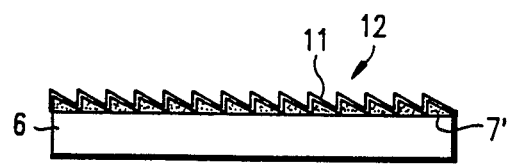

The thus obtained blazed diffraction grating 10 is a transparent diffraction grating if the photosensitive resin 7 is made of a transparent material. The diffraction grating can be easily made into a diffraction grating 12 of the reflection type by forming a reflecting film 11 on it by vacuum deposition or the like as shown in FIG. 9.

The resulting diffraction grating may be provided with the desired surface finishing such as the known anti-reflection film that can be applied to optical devices. In the case where the photosensitive resin 7 or 7' is mechanically weak, it may be provided with a protective coating of $SiO_2$ or $TiO_2$ by deposition, sputtering, etc.

The pitch of the blaze diffraction grating can be made as fine as 1 μm by ordinary photolithography.

Figure 16:
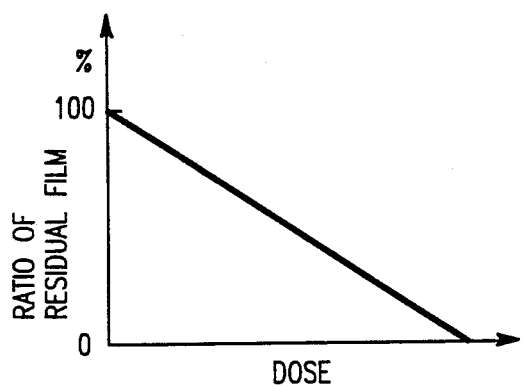
FIG. 16 is a graph showing the relationship between the ratio of residual film and the exposure of the photosensitive resin which is exposed through the photomask shown in FIG. 10.

In the case where a transmittance modulation photomask as shown in FIG. 10 is used, the photosensitive resin should be a photoresist which is adjusted such that the ratio of residual film after exposure and development changes linearly with dose (amount of exposure) as shown in FIG. 16. Thus there is obtained a blazed diffraction grating 10 as shown in FIG. 8.

Figure 13:
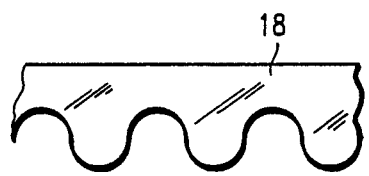
FIG. 13 is a sectional view showing the major part of a sinusoidal diffraction grating used in the present invention.

So far there was described the process for producing a blazed diffraction grating. The process may also be modified to give a sinusoidal diffraction grating as shown in FIG. 13. In this case the photomask is produced in the same manner as mentioned above except that the blazed diffraction grating 1 as shown in FIG. 1 is replaced by the sinusoidal diffraction grating 18 as shown in FIG. 13.

According to the present invention, it is possible to produce a diffraction grating of any desired configuration. It is not always necessary that the diffraction grating have a uniform pitch and/or depth. Therefore, the present invention can be applied to the production of relief modulation diffraction gratings in the form of Fresnel lenses, zone plate lenses, etc.

Figure 14:
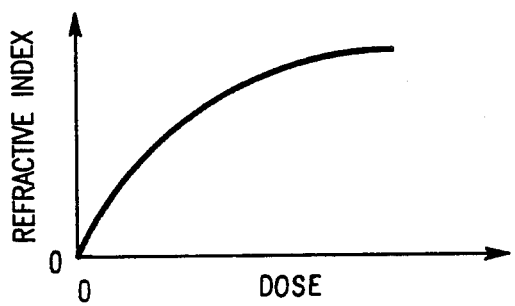
FIG. 14 is a graph showing the relationship between the change of refractive index and the exposure of photosensitive resin (photo-resist).

It is possible to produce a diffraction grating of the refractive index modulation type using the photomask of the present invention if the photosensitive resin having a transmittance T which varies with thickness as shown in FIG. 5 is replaced by one having a refractive index which varies with dose (exposure) as shown in FIG. 14. In this case, the pitch and/or refractive index can be selected as desired as in the above-mentioned diffractive grating of the relief modulation type.

To further illustrate the invention, and not by way of limitation, the following examples are given.

Preparation of Photomask

EXAMPLE 1

A pyrex glass substrate 2 having a refractive index N of 1.470 was provided with the surface of blazed diffraction grating 3 in serrate form, 6 μm in pitch and 1 μm in depth, formed by using ruling engine. Then, the surface of the blazed diffraction grating 2 was coated by spin coating with a solution composed of 0.87 grams of cellulose acetate, 0.13 grams of methylmethacrylate-tetrafluoroethyl methacrylate copolymer, 0.01 grams of 2,2-hydroxy-4-methoxybenzophenone (ultraviolet ray absorber), and 20 grams of DMF (dimethyl formamide). The spin coating process was followed by baking at 50° C. for about 2 hours to increase adherence between the substrate 2 and the layer 4 of the ultraviolet ray absorber. The thickness of the coated film was about 6 μm at the thickest part and about 5 μm at the thinnest part. The surface of the coated film was smooth.

The ultraviolet light absorber 4 used in this example had a transmittance T (for ultraviolet light) which varied with thickness as defined by the following equation and as shown in FIG. 3:

log (1/T) or thickness

The fact that the glass substrate had a refractive index of 1.470 and the absorber layer had a refractive index of 1.471 led to the advantage that almost no diffraction took place between the glass grating 2 and the polymer layer 4. Therefore, the blazed diffraction grating 5 constructed as shown in FIG. 2 formed a photomask the ultraviolet ray transmittance of which varied periodically according to the pattern of the original diffraction grating as shown in FIG. 4.

EXAMPLE 2

A transparent substrate 19 of quartz glass was coated by spin coating with a methylmethacrylateglycidyl methacrylate copolymer containing 8% by weight of 2,2-dihydroxy-3-methoxybenzophenone (ultraviolet light absorber). The coating was subjected to a light-induced cross linking reaction so that the coating layer became solvent-resistant in the photolithography process. The coating layer A had a refractive index of 1.51.

Figure 15:
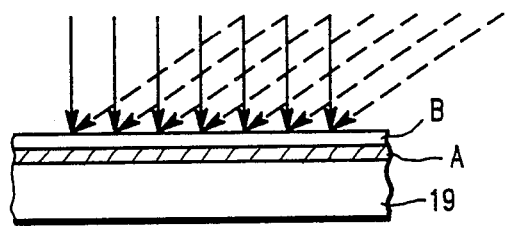
FIG. 15 is a schematic diagram showing the exposure method employed in producing the transmittance modulation photomask according to the present invention.

The coating layer A was further coated with photoresist AZ-1400 (made by Shiplay Company, Ltd.) to form the coating layer B. On the coating layer B was formed the pattern of the blazed grating by the double-beam interference method which employs vertical incident light (indicated by solid lines) and slant incident light (indicated by dotted lines) as shown in FIG. 15. The coating layer B was subjected to oxygen plasma etching, by which the blazed grating on the coating layer B was transferred to the coating layer A. The coating layer A having the blazed relief was coated by spin coating with a methylmethacrylate-glycidyl methacrylate copolymer having a refractive index of 1.51— which was almost exactly equal to that of the coating layer A. Thus there was obtained a photomask of the transmittance modulation type which provided periodically changing light transmittance.

EXAMPLE 3

The same procedure as in Example 2 was repeated to produce a photomask with the following exceptions. The coating layer B was formed from a photoresist the ratio of residual film of which varied depending on the amount of exposure in photolithography as shown in FIG. 16. The pattern of blazed gratings (at a pitch of 6 μm) as shown in FIG. 10 was formed by irradiation with a laser beam the exposure of which was properly controlled. The resulting blazed grating, 6 μm in pitch and 1 μm in height, was transferred by oxygen plasma etching.

The thus obtained photomask was found to be of the transmittance modulation type as shown in FIG. 12 according to the result of measurements of the transmittance of ultraviolet light.

Preparation Of Diffraction Grating

EXAMPLE 4

A glass substrate was coated to a thickness of about 3 μm with a photosensitive resin composition (composed of 2-butenyl methacrylate-methylmethacrylate copolymer and m-benzoylbenzophenone) the film thickness of which after exposure was proportional to exposure. After drying, the coating layer was irradiated with ultraviolet rays through the 95% transmittance part of the photomask prepared in Example 3, so that the amount of exposure was adjusted to 10 J/cm$^2$. The irradiated layer was heat-treated in vacuum. Thus there was obtained a blazed diffraction pattern 6 μm in pitch and 1 μm in height.

SUMMARY

As mentioned above, according to the present invention it is possible to produce an analog photomask of the transmittance distribution control type. The process of the invention makes it possible to form the blazed pattern diffraction gratings on the substrate by a single exposure using the photomask of the invention. Therefore, it simplifies the production process and permits mass production.

What is claimed as new and desired to be secured by Letters Patent of the United States is:

1. A transmittance modulation photomask which comprises:
   (a) a first blazed diffraction grating made of a transparent material and
   (b) a second blazed diffraction grating made of a material containing a ray absorbing agent, wherein:
   (c) said first diffraction grating and said second diffraction grating mate with each other at their respective grating surfaces;
   (d) the refractive index of the material constituting said first diffraction grating is at least approximately equal to the refractive index of the material constituting said second diffraction grating; and
   (e) the upper and lower surfaces of the photomask are at least approximately parallel to each other.

2. A photomask as claimed claim 1 wherein the difference between the refractive index of the material constituting said first diffraction grating and the refractive index of the material constituting said second diffraction grating is smaller than 0.01.

3. A photomask as claimed in claim 2 wherein the difference between the refractive indices is smaller than 0.001.

4. A photomask as claimed in claim 1 wherein the grating surfaces of said first and second diffraction gratings are serrate in cross section.

5. A photomask as claimed in claim 1 wherein the grating surfaces of said first and second diffraction gratings are curved in cross section.

6. A method for producing a transmittance modulation photomask which comprises the steps of:
   (a) forming a first diffraction grating made of a transparent material and having a planar rear surface;
   (b) forming a second diffraction grating made of a material having at least approximately the same refractive index as the material of which said first diffraction grating is made, containing a ray absorbing agent, and having a planar rear surface; and
   (c) joining said first and second diffraction gratings at their respective diffraction surfaces such that their respective planar rear surfaces are at least approximately parallel to each other.

7. A method for producing a photomask as claimed in claim 6 wherein the difference between refractive index of the material constituting said first diffraction grating and the refractive index of the material constituting said second diffraction grating is smaller than 0.01.

8. A method for producing a photomask as claimed in claim 7 wherein the difference between the diffractive indices is smaller than 0.001.

9. A method for producing a photomask as claimed in claim 6 wherein the grating surface on said first diffraction grating is formed by cutting.

10. A method for producing a photomask as claimed in claim 6 wherein the grating surface on said first diffraction grating is formed by photolithography.

11. A method for producing a photomask as claimed in claim 10 wherein the grating surface on said first diffraction grating is formed by drawing directly on a photoresist on the substrate by changing dose.

12. A method for producing a photomask as claimed in claim 10 wherein the grating surface on said first diffraction grating is formed directly by the asymmetric double-beam interference exposure method.

13. A method for producing a photomask as claimed in claim 6 wherein said first diffraction grating is formed by the steps of:
   (a) forming a layer of photosensitive resin on a substrate;
   (b) forming the grating surface on said photosensitive resin by exposure and photolithographic development; and (c) transferring the grating surface to the substrate by dry etching using said grating surface as a photomask.

14. A method for producing a photomask as claimed in claim 13 wherein the substrate is formed by coating a glass plate with a transparent material.

15. A method for producing a photomask as claimed in claim 13 wherein the substrate is formed by coating a glass plate with a transparent material containing a light absorbing agent.

16. A method for producing a photomask as claimed in claim 13 wherein the transfer is accomplished by oxygen plasma etching.

17. A method for producing a photomask as claimed in claim 16 wherein the light absorbing agent is an ultraviolet light absorbing agent.

* * * * *